(12) United States Patent
Takushima et al.

(10) Patent No.: US 8,067,132 B2
(45) Date of Patent: Nov. 29, 2011

(54) PHOTOMASK AND EXPOSURE METHOD

(75) Inventors: Katsuhiro Takushima, Tokyo (JP); Takashi Yasui, Osaka (JP)

(73) Assignees: Hoya Corporation, Tokyo (JP); Matsushita Electric Industrial Co., Ltd., Osaka (JP)

( * ) Notice: Subject to any disclaimer, the term of this patent is extended or adjusted under 35 U.S.C. 154(b) by 250 days.

(21) Appl. No.: 11/802,005

(22) Filed: May 18, 2007

(65) Prior Publication Data

US 2007/0287077 A1 Dec. 13, 2007

(30) Foreign Application Priority Data

May 18, 2006 (JP) ................................. 2006-139573

(51) Int. Cl.
*G03F 1/00* (2006.01)
*H01L 21/00* (2006.01)

(52) U.S. Cl. ............................................ 430/5; 430/311
(58) Field of Classification Search .................... 430/5
See application file for complete search history.

(56) References Cited

U.S. PATENT DOCUMENTS

| 6,558,855 | B2 * | 5/2003 | Tanaka et al. | 430/5 |
|---|---|---|---|---|
| 6,656,644 | B2 * | 12/2003 | Hasegawa et al. | 430/5 |
| 6,803,158 | B1 * | 10/2004 | Gordon et al. | 430/5 |
| 6,902,868 | B2 * | 6/2005 | Hasegawa et al. | 430/311 |
| 7,205,074 | B2 * | 4/2007 | Boyd | 430/5 |
| 2002/0086223 | A1 | 7/2002 | Hattori et al. | |
| 2003/0143472 | A1 * | 7/2003 | Koizumi et al. | 430/5 |
| 2004/0151993 | A1 * | 8/2004 | Hasegawa et al. | 430/5 |
| 2005/0238964 | A1 * | 10/2005 | Chu et al. | 430/5 |

FOREIGN PATENT DOCUMENTS

| JP | 10083070 | 3/1998 |
|---|---|---|
| JP | 2000-352812 A | 12/2000 |
| KR | 100798969 B1 | 1/2008 |

OTHER PUBLICATIONS

Korean Office Action corresponding to Korean Patent Application No. 10-2007-0048603 dated Dec. 14, 2010.
Japanese Office Action from corresponding Japanese Patent Application No. 2006-139573 dated Jul. 5, 2011.

* cited by examiner

*Primary Examiner* — Mark F Huff
*Assistant Examiner* — Jonathan Jelsma
(74) *Attorney, Agent, or Firm* — Sughrue Mion, PLLC

(57) ABSTRACT

To provide a photomask capable of preventing a foreign matter generation in using the photomask, and an exposure method using this photomask. The photomask includes a transparent substrate 2; a transfer pattern 4 formed in a main region 3 of a center portion of the transparent substrate 2; a light-shading band region 5 provided adjacent to the main region 3 in the outer peripheral region of the main region 3; and a pellicle 6 formed by adhering a pellicle film 6a to a pellicle frame 6b by an adhesive 8a, wherein this pellicle 6 is adhered onto a light-shading region 7 consisting of a light-shading film formed in the outer peripheral region of the main region 3, through an adhesive 8b.

11 Claims, 5 Drawing Sheets

FIG. 5

| BOND | ENERGY (KJ/mol) |
|---|---|
| C–C | 348 |
| C=C | 607 |
| C≡C | 828 |
| C–O | 352 |
| C=O | 516 |

| EXPOSURE LIGHT WAVELENGTH ($\lambda$) | BOND ENERGY (KJ/mol) |
|---|---|
| 356 | 327 |
| 248 | 482 |
| 193 | 620 |

PHOTOMASK AND EXPOSURE METHOD

CROSS REFERENCE TO RELATED APPLICATION

This application claims priority based on Japanese Patent Application No. 2006-139573, filed May 18, 2006, the contents of all of which are incorporated herein by reference in their entirety.

TECHNICAL FIELD

The present invention relates to a photomask used for a pattern transfer using an exposure apparatus and an exposure method using this photomask, in a manufacture of a semiconductor device.

BACKGROUND ART

Irradiation of exposure light is performed through a photomask (reticle), for example, to form a transfer pattern in a manufacture of the semiconductor device.

A photomask formed with a light-shading film pattern on a transparent substrate composed of a rectangular quartz glass is conventionally used, and as a material of a light-shading film, a chromium-based material (elementary chromium, or chromium containing nitrogen, oxygen, and carbon, etc, or a lamination film of these material films) is generally used.

Further, in recent years, a phase shift mask has been developed for practical use, to improve a resolution of the transfer pattern. Various types (for instance, a Levenson-type, an assist-pattern-type, and a self-matching type, etc) are known as the phase shift mask, and as one of them, a halftone phase shift mask suitable for the pattern transfer of a hole and a dot with high resolution is known.

This halftone type phase shift mask is obtained by forming a light translucent film pattern having a phase shift amount of about 180 deg, wherein the light translucent film is sometimes formed of a single layer or sometimes formed of multi-layers. For example, patent document 1 discloses the light translucent film pattern formed of a thin film composed of a substance containing metal such as molybdenum, silicon, and nitrogen as main constituent elements.

The light translucent film with such materials is excellent in acid resistance and resistance to light, in addition to having an advantage capable of controlling a prescribed phase shift amount and transmittance by a single layer.

When manufacturing these photomasks, it is necessary to form a fine pattern and therefore a pattern forming method of the photomask generally includes the steps of forming a resist pattern by exposing the resist to light by performing pattern drawing by an electron beam exposure apparatus; and thereafter forming the pattern by dry etching.

Note that as the kinds of the resist, there are a positive resist and a negative resist.

The positive resist is the resist having a property that a part irradiated with electron beam is removed by a resist developer, and the negative resist is the resist having a property that a part excluding the part irradiated with the electron beam is removed by the resist developer.

The choice as to which of the positive resist and the negative resist is used is made, to select more preferable one in terms of forming the pattern or shortening of drawing time of the electron beam exposure apparatus.

In addition, the aforementioned transfer pattern is formed in a rectangular main region located in a center portion of the rectangular transparent substrate, and during using the photomask, outer peripheral part of this main region is shield by a masking blind provided in the exposure apparatus, and the pattern of the main region is transferred to the resist on the transfer substrate.

In addition, in order to prevent the transfer to the outer peripheral part of this main region by leaked light, the photomask generally has a light shading band region adjacent to the main region.

In addition, in the photomask, a mark pattern, etc. of an alignment mark, etc, generally used for aligning with each kind of devices for photomask exists mainly in the peripheral part of the main region depending on specifications of each exposure apparatus manufacturer, a photomask user, and a photomask manufacturer.

Conventionally, when the pattern transferring is made using the positive resist, the peripheral region of the main region, excluding a desired mark pattern, is made, as a non-drawing region, where a light-shading film is formed.

On the other hand, when the pattern transferring is made with the negative resist, the peripheral region of the main region, excluding desired mark pattern and light-shading band, is made as, the non-drawing region, where the transparent substrate is exposed.

Namely, exposing patterns on the resist are performed by scanning a substrate surface based on pattern data.

Therefore, it is general to shorten a drawing time to avoid drawing, patterns on an unnecessary region.

Further, in order to prevent adhesion of foreign matters to the formed pattern, it is general to use the photomask by mounting a protective film called a pellicle.

The pellicle is formed by adhering a pellicle film consisting of a transparent polymer membrane to a pellicle frame usually consisting of metal, and this pellicle frame is attached to a surface of the photomask by using an adhesive.

More specifically, the pellicle frame is adhered to an outside of the light-shading band by using the adhesive, to cover the main region and the light-shading band.

In addition, in order to prevent the foreign matters from adhering onto the photomask, the adhesive is sometimes provided to an inner surface of the pellicle frame.

Note that the aforementioned each kind of mark pattern could exists not only in the pellicle but also outside the pellicle.

Incidentally, it is known that when the pattern transfer is performed by using the photomask, with pellicle mounted thereon, the pellicle is irradiated with laser beams, thereby accelerating reaction of ammonium ions that exist in the pellicle (in the air) and sulfate ions which are used for cleaning the photomask and are remained on the photomask, then, ammonium sulfate is deposited, and such the foreign matters are adhered onto the photomask (for example, patent document 1).

(Patent document 1) Japanese Patent Laid Open No. 2000-352812

However, in the photomask, with the transfer pattern formed thereon by using the negative resist, namely, the photomask, with the non-drawing region, namely the transparent substrate exposed in the peripheral region of the main region excluding the desired mark pattern and the light-shading band, there occurs a problem that a plurality of foreign matters are found in the photomask after use.

In addition, it is found that above problem is more remarkable in the photomask with the transfer pattern formed thereon by using the negative resist than in the photomask with the transfer pattern formed thereon by using the positive resist.

Accordingly, regarding the photomask with the transfer pattern formed thereon by using the negative resist, namely, the photomask, with the non-drawing region, namely, the transparent substrate exposed in the peripheral region of the main region excluding a desired mark pattern and the light-shading band, there is a problem that the photomask becomes unusable with a few using times.

As a cause of generating the aforementioned problem, there is given such a case that when the adhesive used for adhering the pellicle frame to the photomask is directly adhered to the transparent substrate, a stray light by a multiple reflection of the exposure light in the exposure apparatus during using the photomask transmits from a rear surface side of the transparent substrate to the transparent substrate, whereby the adhesive used for adhering the pellicle frame to the photomask, or the adhesive used for adhering the pellicle film to the pellicle frame, and further the adhesive inside of the pellicle frame if the adhesive is given thereto are irradiated with this stray light, and as a result, gas generated from the adhesive, being an organic substance, becomes a deposited substance, and would be adhered onto the photomask.

In addition, when the adhesive is not applied to the inside of the pellicle frame, it can be considered that components remained by an alumite treatment of the pellicle frame (including a coloring process) or the component remained by coating processing, etc, of the pellicle frame are deposited by irradiating the pellicle frame with the stray light which is caused by the multiple reflection, etc, of the exposure light in the exposure apparatus when using the photomask, and this stray light transmits the transparent substrate from the rear surface side to emit onto the pellicle frame, thereby adhering a deposit onto the photomask.

In addition, it is confirmed that the aforementioned problem becomes more remarkable, as a light source wavelength of the used exposure apparatus becomes shorter from the present KrF excimer laser (wavelength of 248 nm) to an ArF excimer laser (wavelength of 193 nm) and a F2 excimer laser (wavelength of 157 nm).

Therefore, there is a problem that even more foreign matters could be generated, as the exposure light wavelength applied by the exposure apparatus becomes shorter, accompanied by applying finer LSI pattern in recent years.

FIG. 5 shows an example of energy possessed by the light source wavelength of the exposure apparatus and a bonding energy of organic substances coming from matters such as the adhesive, etc.

In this way, as the wavelength of the light source of the exposure apparatus becomes shorter, it can be considered that the bonding energy possessed by molecules of the adhesive is more liable to be cut, and simultaneously a polymerization reaction or a radical reaction could occur, and as a result, generation of gas or generation of deposits become even remarkable.

SUMMARY OF THE INVENTION

In view of the above-described problems, the present invention is provided, and an object of the present invention is to provide a photomask capable of preventing foreign matters from generating at the time of using the photomask, such as the photomask including a light transmitting region, with a transparent substrate exposed in an outer peripheral region of a main region, namely, the photomask, with a non-drawing a region, i.e. the transparent substrate exposed in the outer peripheral region of the main region, excluding a desired mark and a light-shading band, and the photomask, with a pellicle frame conventionally adhered to the transparent substrata directly, and an exposure method using this photomask.

In order to solve the above-described problem, the present invention has several structures as described below.

(Structure 1) There is provided a photomask, which is used for a pattern transfer with an exposure apparatus, including a transparent substrate; a desired transfer pattern formed in a main region of a center portion of the transparent substrate; and a pellicle mounted so as to cover a region including the main region by adhering a pellicle frame to an outer peripheral region of the main region, wherein said photomask includes a light-transmitting region in the outer peripheral region of said main region, the transparent substrate being exposed in said light-transmitting region, and a region including a surface to which the pellicle frame is adhered is formed of a light-shading region formed with a light-shading film having a light-shading property to an exposure light of the exposure apparatus.

(Structure 2) There is provided the photomask according to the structure 1, which has a light-shading band region covered with a pellicle together with the main region, adjacent to the main region, in the outer peripheral region of the main region.

(Structure 3) There is provided the photomask according to either of the structure 1 or 2, wherein the transfer pattern is a pattern formed by using a negative resist.

(Structure 4) There is provided the photomask according to the structure 2, wherein said transfer pattern is a pattern formed by using a negative resist.

(Structure 5) There is provided the photomask according to the structures 1, wherein said transfer pattern is a pattern formed by using a positive resist.

(Structure 6) There is provided the photomask according to the structures 2, wherein said transfer pattern is a pattern formed by using a positive resist.

(Structure 7) There is provided the photomask according to the structure 1, wherein the exposure light of said exposure apparatus is a light that causes a photoreaction of a constituent material of a pellicle frame and/or an adhesive, when said pellicle frame and/or said adhesive used in said pellicle is irradiated with this light.

(Structure 8) The photomask according to the structure 1, wherein the exposure light of said exposure apparatus is a laser beam with a wavelength of 200 nm or less.

(Structure 9) There is provided an exposure method wherein a pattern transfer is performed by using the photomask according to the structure 1 in the exposure apparatus.

Note that in the present invention, the photomask including the light-transmitting region, with the transparent substrate exposed in the outer peripheral region of the main region refers to the photomask, with the non-drawing region, i.e. the transparent substrate exposed in the outer peripheral region of the main region, excluding a desired mark and the light-shading band, and refers to the photomask, with the pellicle frame conventionally adhered to the transparent substrate directly.

In addition, the light-shading film includes not only a film substantially shading all of the exposure lights, but also a film that allows the exposure light to partially pass through, and a light semi-transmitting film with transmittance of 30% or less to the exposure light used in a halftone phase shift mask, for example.

According to the photomask of the present invention, the light-shading region formed of the light-shading film is provided below the pellicle frame, and the pellicle frame is adhered onto this light-shading film through the adhesive.

Therefore, a stray light by a multiple reflection of the exposure light in the exposure apparatus during using the photomask transmits from a rear surface side of the transparent substrate to the transparent substrate, whereby the adhesive used for adhering the pellicle frame to the photomask, or the adhesive used for adhering the pellicle film to the pellicle frame, and further the adhesive inside of the pellicle frame if the adhesive is given thereto are irradiated with this stray light, and as a result, gas generated from the adhesive, being an organic substance, becomes a deposited substance, and would be adhered onto the photomask.

In addition, when the adhesive is not applied to the inside of the pellicle frame, components remained by an alumite treatment of the pellicle frame (including a coloring process) or the component remained by coating processing, etc, of the pellicle frame are deposited by irradiating the pellicle frame with this stray light.

The aforementioned light-shading film prevents the aforementioned adhesives and the remaining component from being irradiated with this stay light, thus consequently preventing gas generation from the adhesive, being the organic matter, and reducing an adhesion of the deposit onto the photomask.

Particularly, the deposit is suitably prevented from generating and adhering onto the photomask, in the photomask used in the exposure apparatus using a high output laser beam with a wavelength of 200 nm or less as the light source of the exposure light, namely, the photomask easily allowing the deposit to be generated on the photomask.

BRIEF DESCRIPTION OF THE DRAWINGS

FIG. 5 is a view showing an energy of an exposure wavelength of an exposure apparatus and a bond energy of organic matters.

DESCRIPTION OF THE PREFERRED
EMBODIMENTS OF THE INVENTION

Preferred embodiments of the present invention will be explained in detail hereunder.

Figure 1:
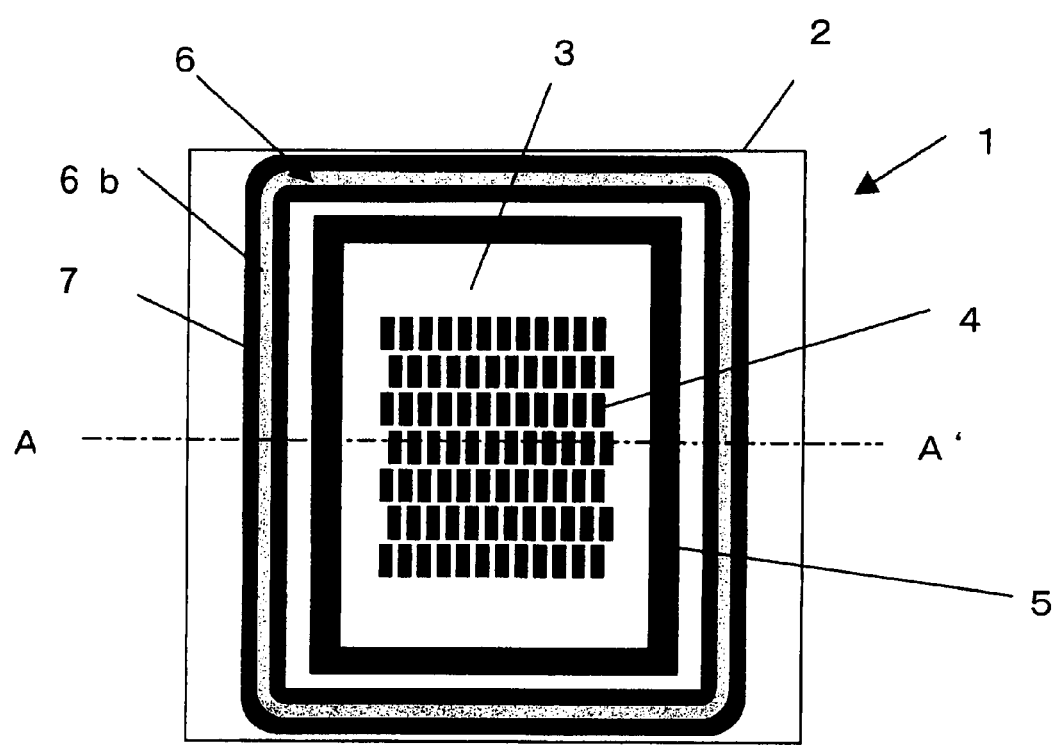
FIG. 1 is a plan view of a photomask in an embodiment of the present invention.
Figure 2:
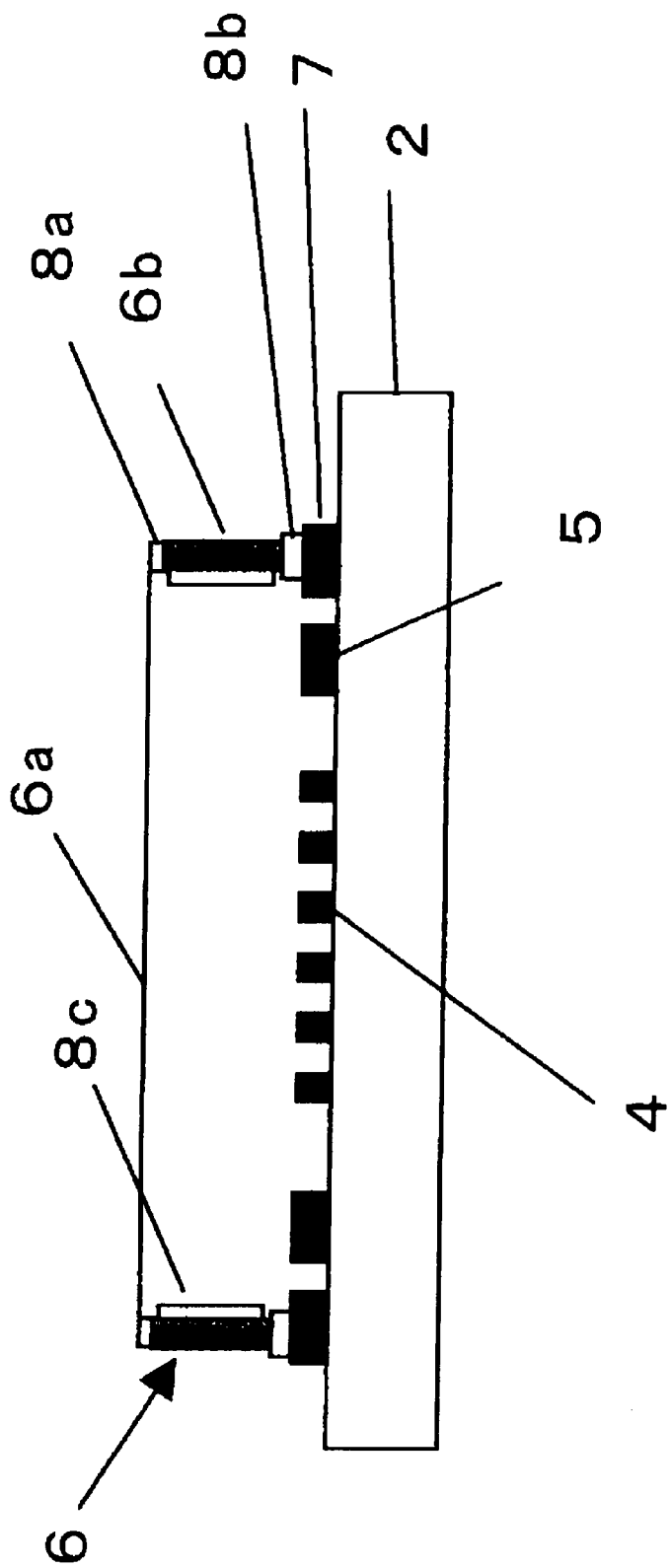
FIG. 2 is a sectional view of the photomask in the embodiment of the present invention.

FIG. 1 is a plan view of a photomask of this embodiment, and FIG. 2 is a sectional view taken along the line A-A' in FIG. 1.

As shown in these figures, a photomask 1 of this embodiment includes a transparent substrate 2, a transfer pattern 4 formed in a main region 3 of a center portion of the transparent substrate 2, and a light-shading band region 5 provided so as to be adjacent to the main region 3 in an outer peripheral region of the main region 3, and a pellicle 6 formed of a pellicle frame 6b, with a pellicle film 6a adhered thereto with an adhesive 8a, is mounted on a light-shading region 7 consisting of a light-shading film formed in the outer peripheral region of the main region 3 by adhering a pellicle frame 6b to this light-shading region 7 through an adhesive 8b, so as to cover the main region 3 and the light-shading band region 5.

Further, in order not to allow foreign matters to adhere to the main region 3 and the light-shading band region 5, an adhesive 8c is adhered to an inner surface of the pellicle frame 6b. However, the pellicle not provided with this adhesive 8c can also be used.

A different point from the conventional photomask is a point that in the conventional photomask, this light-shading region does not exist, while in the present invention, the light-shading region 7 exists.

As the transparent substrate 2, a substrate with a size of 6 inches×6 inches×0.25 inches made of synthetic quartz glass is most generally used.

The transfer pattern 4 is a pattern to be transferred to a transfer substrate such as a semiconductor wafer to form a device pattern, and a pattern consisting of a light-shading film in a case of a binary mask, and is a pattern consisting of a light semi-transmitting film in a case of a halftone phase shift mask, for example, out of phase shift masks.

As a material of the light-shading film, a chromium-based material (elementary chromium or chromium containing nitrogen, oxygen, and carbon. etc. or a lamination film of these material films) is most generally used.

As the light semi-transmitting film of the halftone phase shift mask, a material containing metal such as molybdenum, silicon, nitrogen as constituent elements is most generally used.

As other transfer pattern, in accordance with the kind of a mask one kind or two kinds of the light-shading film, the light semi-transmitting film, and an engraving and etching pattern of a substrate can be mixed.

The light-shading band region 5 is formed of the light-shading film consisting of the same kind of material as the light-shading film used in the transfer pattern of the binary mask. In the halftone phase shift mask also, the light-shading band region is formed of the light-shading film on the light semi-transmitting film.

As the light-shading film of the light-shading band region, in the phase shift mask, the light-shading film used as an etching mask of a phase shifter, etc, is generally formed in the outer peripheral region of the main region so as to be remained by a prescribed width.

In addition, in the aforementioned light-shading region 7 also, in the same way as the light-shading band region, usually, the light-shading film consisting of the same material as the light-shading film used in the transfer pattern of the binary mask can be used. Further, it is preferable to form the light-shading region 7 with at least a width capable of intercepting the stray light of the exposure light, and with a minimum necessary width so as not to increases a drawing time by setting an unnecessary drawing region when manufacturing the photomask.

Specifically, in consideration of increasing the width with respect to a pellicle frame width by a positional deviation or the like (called pellicle attachment positional accuracy) in press-adhesion of the pellicle frame to the photomask, it is preferable to set both sides of the pellicle frame width at a 0.3 mm added width or more, and is further preferable to set them at a 0.5 mm added width or more.

In addition, when the both sides of the pellicle frame width are added with 10.0 mm, a sufficient effect of intercepting the stray light would be obtained, and therefore an upper limit is preferably set at 5.0 mm or less from the point of shortening the drawing time.

Note that the width of the light-shading region is not necessarily set so that the both sides and all circumference of the pellicle frame are added by the same width, and different added widths and a locally different width may be set in the inside (main region side) and the outside (outer peripheral side of the main region), because a position of the mark that suitably exists must be taken into consideration.

Further the width of the light-shading region may be set to an added width different in right and left/up and down of the pellicle frame.

In addition, in FIG. 1, the light-shading band region 5 and the light-shading region 7 therebetween disposed below the pellicle frame are formed, with a light-transmitting part to separate them.

However, when the light-shading band region 5 and the light-shading region 7 are to be close to each other, the light-shading region 7 may be formed by connecting an entire area of the light-shading region and the light-shading band region or locally connecting them.

Moreover, in the pellicle 6, the pellicle 6b is obtained by applying alumite treatment to metal such as aluminum to suppress light scattering, and the pellicle film 6a consists of a high polymer film such as a transparent fluorine-containing polymer, and as adhesives 8a, 8b, and 8c, an organic adhesive such as fluorine-containing, silicone type, or styrene-butylene copolymer can be used.

In addition, the adhesive 8c of the inside of the pellicle may be provided as needed.

A pellicle shape of the pellicle 6, a pellicle frame dimension, and the adhesive can be standardized by a pellicle supply manufacturer in compliance with the exposure apparatus, used exposure wavelengths, and other use purposes.

Therefore, by inserting the light-shading film that conforms to a pellicle type mounted on a manufactured lithography mask, into data for drawing the mask, the pellicle 6 can be formed in the same way as manufacturing a usual lithography mask.

As is described in this embodiment, the photomask including the light-transmitting region in the outer peripheral region of the main region is generally obtained when the transfer pattern is formed by using the negative resist.

In this point, a manufacturing method of the photomask of this embodiment will be explained, with the binary mask as an example, by using a manufacturing step view of FIGS. 3A-3D.

First, a light-shading film 9 is formed on the transparent substrate 2 by using a sputtering film-forming apparatus, etc, and a photomask blank 11 formed with a negative resist film 10 thereon is prepared (FIG. 3 A).

This photomask blank 11 is a photomask blank for ArF excimer laser with a light shielding rate of 99.9% or more, in the ArF excimer laser (wavelength of 193 nm), for example.

Figure 3A:
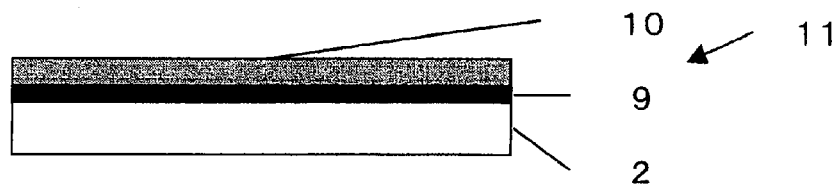
FIGS. 3A-3D illustrate steps in the manufacturing of the photomask according to an embodiment of the present invention is a view of a manufacturing step of the photomask in the embodiment of the present invention.
Figure 3B:
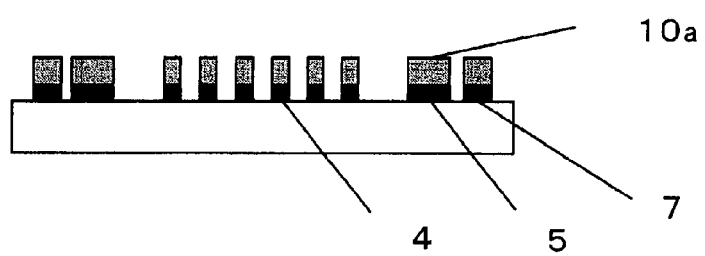

Next, by using an electron beam exposure apparatus, etc, the transfer pattern, a pattern for forming the light-shading band region, and a pattern for forming the light-shading region disposed below the pellicle frame are drawn on the negative resist film 10, and a resist pattern 10a is formed by a processing such as developing and baking the resist (FIG. 3B).

In this embodiment, the transfer pattern is a line pattern, and therefore it is preferable to remove the resist of the region excluding the region where the pattern is drawn by development of the resist. This is a reason why the negative resist is used. Accordingly, the resist other than the transfer pattern, the pattern for forming the light-shading band region and the pattern for forming the light-shading region is removed by development.

Next, by etching the light-shading film 9 by dry-etching, pattern formation of the transfer pattern 4 consisting of the light-shading film, the light-shading band region 5 consisting of the light-shading film, and the light-shading region 7 consisting of the light-shading film is performed (FIG. 3B).

Figure 3C:
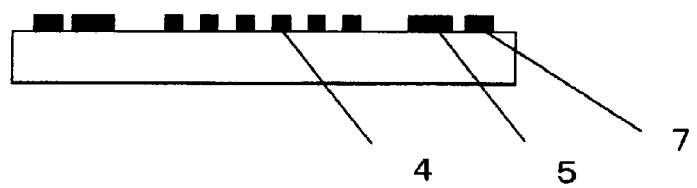

Next, by performing removal and cleaning the resist, the transfer pattern 4 consisting of the light-shading film, the light-shading band region 5 consisting of the light-shading film, and the light-shading region 7 consisting of the light-shading film are exposed (FIG. 3C).

In this way, as is seen in this embodiment, when the transfer pattern is formed by using the negative resist, the outer peripheral region of the main region is formed of the light-transmitting region, excluding the light-shading band region 5 and the light-shading region 7.

Figure 3D:
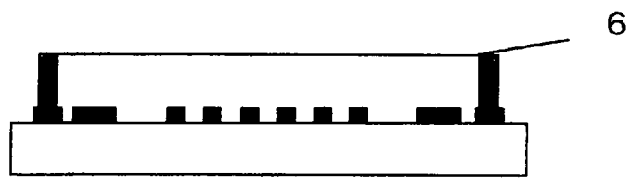

Thereafter, a CD measurement, a defect inspection, and a correction of a pattern defect are performed, and after a final cleaning and inspection, a quality of the photomask is guaranteed. In this case, the pellicle 6 is mounted on the light-shading region 7, so as to suit to the light-shading region 7 consisting of the light-shading film (FIG. 3D).

Mounting of the pellicle 6 is performed by pressuring the pellicle through the adhesive by using pressure equipment called a pellicle mounting systems.

EXAMPLE

The present invention will be explained further in detail hereunder, by using an example.

Example

This example shows an example of applying the present invention to the halftone phase shift mask.

Figure 4A:
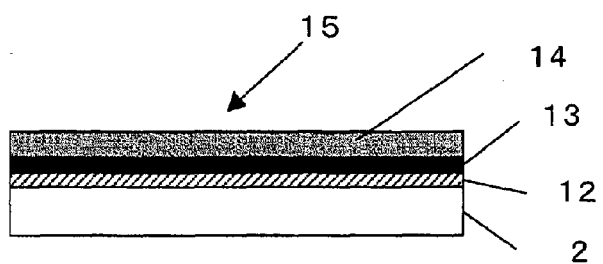
FIGS. 4A-4G illustrate steps in the manufacturing of a halftone phase shift mask according to an embodiment of the present invnetion is a view of the manufacturing step of a halftone phase shift mask in an example of the present invention.

Namely, as shown in FIGS. 4A-4G, in the photomask of this example, a photomask blank 15 is prepared by firstly forming a light semi-transmitting film 12 of a single film structure substantially consisting of metal such as molybdenum, silicon, and nitrogen on the transparent substrate 2, forming a chromium-based light shading film 13 thereon, and further forming a negative resist film 14 thereon (FIG. 4A).

The aforementioned light semi-transmitting film 12 is formed by using a mixture target (Mo:Si=8:92 mol %) of the molybdenum (Mo) and silicon (Si), in a mixture gas atmosphere (Ar:N2=10%:90%, pressure: 0.2 Pa) of argon (Ar) and nitrogen (N2), by reactive sputtering (DC sputtering), on the transparent substrate 2. This photomask blank 15 is an ArF excimer laser photomask blank with transmittance of about 5.5% and phase shift amount of about 180 deg, in the ArF excimer laser (wavelength of 193 nm).

Next, by using an electron beam drawing apparatus, the transfer pattern, the pattern for forming the light-shading band region, and the pattern for forming the light-shading region disposed below the pellicle are drawn on the negative resist film 14, and a resist pattern 14a is formed by the processing such as development and baking of the resist.

Next, by etching the light-shading film 13 by dry etching using Cl2+O2 gas, an etching mask pattern 16 for forming the transfer pattern consisting of the light-shading film, a light-shading band region 17 consisting of the light-shading film, and a pattern of a light-shading part 13a consisting of a light-shading region 18 consisting of the light-shading film are formed.

Figure 4B:
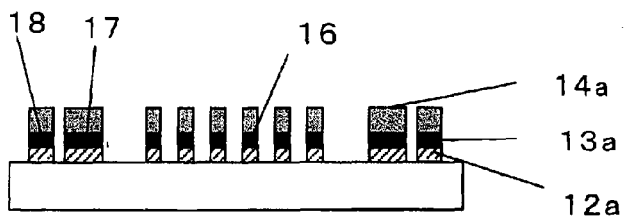

Next, by dry-etching the light semi-transmitting film 12, with the resist pattern 14a and the light-shading part 13a as masks, a light semi-transmitting part 12a is formed, and formation of the transfer pattern consisting of a lamination structure of the light semi-transmitting part and the light-shading film, and a pattern of the light-shading band region and the light-shading region is performed (FIG. 4B).

Figure 4C:

Next, resist removal and cleaning are performed (FIG. 4C).

Figure 4D:
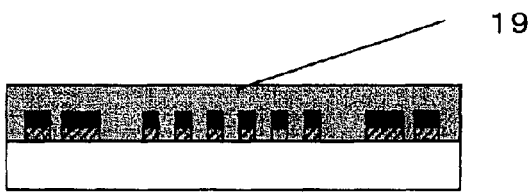

Next, the substrate already passed through the aforementioned steps is coated with the negative resist film 19 (FIG. 4D).

Figure 4E:
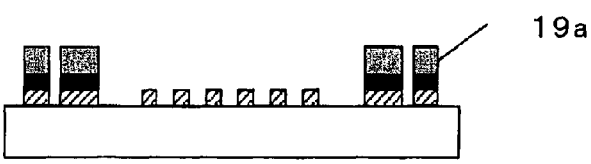

Thereafter, the negative resist film 19 on the light-shading band region 17 and the light-shading region 18 is exposed to light, and the processing such as development and baking is performed to form a resist film pattern 19a and is subjected to etching, after exposing the etching mask pattern 16 for forming the transfer pattern, being an unnecessary part of the light-shading part 13a (FIG. 4E).

Figure 4F:
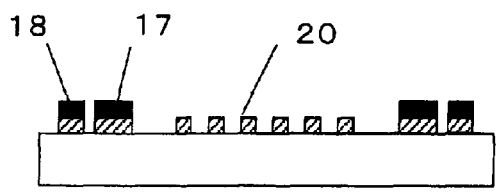

Then, resist removal and cleaning are performed, to form a transfer pattern 20 consisting of the light semi-transmitting film 12a. (FIG. 4F)

Figure 4G:
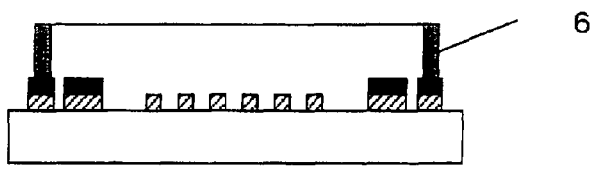

Thereafter, the CD measurement, defect inspection and correction of pattern defect are performed, and after final cleaning and inspection, the quality of the photomask is guaranteed, and the pellicle 6 is mounted on the light-shading region 7 so as to suit to the light-shading region 7 consisting of the light-shading film (FIG. 4G).

The photomask obtained by this embodiment is used in a semiconductor manufacturing exposure apparatus using the ArF excimer laser as the light source of the exposure light, and when the number of foreign matter defects before use and the foreign matter defects after use are inspected by using a foreign matter inspection apparatus (KLA—manufactured by Tencor corporation, STARlight), it is found that the number of the foreign matter defects after use is the same zero as the number of foreign matter defects before use.

Comparative Example

The foreign matter defect inspection similar to the aforementioned example was performed, for the photomask similar to the aforementioned example excepting that the pellicle is directly adhered to the transparent substrate, without forming the light-shading region 18. As a result, about 2500 foreign matter defects after use was detected, while the number of the foreign matter defects before use was zero.

In addition, a lot of foreign matters thus detected were particularly observed in the vicinity of the inside of the pellicle frame, and therefore these foreign matters are considered to be generated by irradiating the vicinity of the pellicle frame with the exposure light.

Note that in the aforementioned example, an example of using the negative resist film is given. However, needless to say, the same resist pattern as the resist pattern formed by the negative resist as shown in the aforementioned example may be formed, by using the positive resist.

In addition, in the aforementioned example, an example of the halftone phase shift mask is given. However, the present invention can be used in all photomasks with pellicle such as binary mask and phase shift mask, and needles to say, can be used in a F2 excimer laser photomask for the exposure apparatus of future generation and a large size photomask such as a liquid crystal.

Further, in the aforementioned example, each kind of mark pattern is not described. However, needless to say, the mark pattern may be suitably formed, in accordance with specifications of each exposure apparatus manufacturer, a photomask user, and a photomask manufacturer. Further, in accordance with the specification of each kind of mark pattern, the light-shading region may be suitably modified.

What is claimed is:

1. A photomask, for a manufacture of a semiconductor device, for transferring a pattern by an irradiation of an exposure light, comprising:

a transparent substrate;

a transfer pattern for exposure of light formed in a main region on the transparent substrate;

a light-shading band for preventing leak of the light out of the main region, said light-shading band comprising a light-shading film and being formed in a peripheral region out of the main region, adjacent to the main region on the transparent substrate and spaced from the transfer pattern formed in the main region; and a pellicle mounted so as to cover the main region by adhering a pellicle frame in the peripheral region, wherein the pellicle frame is adhered on a light-shading region formed in the peripheral region on the transparent substrate, said light-shading region comprising the light-shading film and having a width of the pellicle frame width added by 0.3 mm up to 5.0 mm on both sides of the pellicle frame, the light-shading film being capable of shading substantially all of the exposure light, and the transparent substrate is exposed in the peripheral region except the light-shading band, light-shading region, and mark patterns including alignment patterns.

2. The photomask of claim 1, wherein the light-shading region and the light-shading band are separated by having the light-transmitting region therebetween.

3. The photomask of claim 1, wherein the light-shading region is formed as connected with the light-shading band.

4. The photomask of claim 1, wherein the transfer pattern is made of a chromium based material or a material comprising metal, silicon, and nitrogen as main constituents.

5. The photomask of claim 1, wherein the exposure light has a wavelength of 200 nm or less.

6. An exposure method, wherein a pattern transfer is performed by using the photomask according to claim 1 with an exposure apparatus.

7. The photomask of claim 1 wherein the transfer pattern comprises a pattern of the light-shading film or a pattern of a light semi-transmitting film, said light-shading film comprising chromium, nitrogen containing chromium, oxygen containing chromium, or carbon containing chromium, or lamination thereof, and said light-semi-transmitting film comprises metal, silicon and nitrogen.

8. The photomask of claim 1 wherein the transfer pattern consists of a pattern of a light-shading film, said light-shading film consists of chromium, nitrogen containing chromium, oxygen containing chromium, or carbon containing chromium, or lamination thereof.

9. The photomask of claim 1 wherein the transfer pattern consists of a pattern of a light-semi-transmitting film, said light-semi-transmitting film consists of metal, silicon, and nitrogen.

10. The photomask of claim 1 wherein the transfer pattern comprises a pattern of a light-shading film, a pattern of a light semi-transmitting film, and a pattern formed by engraving the substrate.

11. A photomask, for a manufacture of a semiconductor device, for transferring a pattern by an irradiation of an exposure light, comprising:

a transparent substrate;

a transfer pattern for exposure of light formed in a main region on the transparent substrate;

a light-shading band for preventing leak of the light out of the main region, said light-shading band comprising a light-shading film and being formed in a peripheral region out of the main region, adjacent to the main region on the transparent substrate and spaced from the transfer pattern formed in the main region; and a pellicle mounted so as to cover the main region by adhering a pellicle frame in the peripheral region, wherein the pellicle frame is adhered on a light-shading region formed in the peripheral region on the transparent substrate, said light-shading region comprising the light-shading film and having a width of the pellicle frame width added by 0.3 mm up to 5.0 mm on both sides of the pellicle frame, the light-shading film being capable of shading substantially all of the exposure light, and the transparent substrate is exposed in the peripheral region except the light-shading band, light-shading region, and mark patterns including alignment patterns, wherein the light-shading region and the light-shading band are separated by having the light-transmitting region therebetween.

* * * * *